US010375830B2

(12) United States Patent
Dawley et al.

(10) Patent No.: US 10,375,830 B2
(45) Date of Patent: Aug. 6, 2019

(54) METHOD OF ASSEMBLING POWER MODULE VIA FOLDING

(71) Applicant: GM GLOBAL TECHNOLOGY OPERATIONS LLC, Detroit, MI (US)

(72) Inventors: Evan J. Dawley, Lake Orion, MI (US); Roger M. Brisbane, Washington, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 196 days.

(21) Appl. No.: 15/612,145

(22) Filed: Jun. 2, 2017

(65) Prior Publication Data

US 2018/0352656 A1 Dec. 6, 2018

(51) Int. Cl.

| | |
|---|---|
| ***H05K 1/18*** | (2006.01) |
| ***H01M 2/22*** | (2006.01) |
| ***H01M 10/655*** | (2014.01) |
| ***H01M 10/6555*** | (2014.01) |
| ***H01M 10/42*** | (2006.01) |
| ***H01M 2/20*** | (2006.01) |
| ***H01M 10/04*** | (2006.01) |

(52) U.S. Cl.

CPC ............ *H05K 1/189* (2013.01); *H01M 2/206* (2013.01); *H01M 2/22* (2013.01); *H01M 10/04* (2013.01); *H01M 10/4207* (2013.01); *H01M 10/655* (2015.04); *H01M 10/6555* (2015.04); *H01M 2010/4271* (2013.01); *H05K 2201/10037* (2013.01)

(58) Field of Classification Search

CPC ........ H01M 2/20; H01M 2/202; H01M 2/204; H01M 2/206; H01M 2/22; H01M 10/425; H01M 10/04; H01M 10/0413; H01M 10/0431; H01M 10/0436; H01M 10/049; H01M 10/4207; H01M 2010/4271; H01M 10/655; H01M 10/6555; H01K 1/189; H01K 2201/10037

See application file for complete search history.

(56) References Cited

U.S. PATENT DOCUMENTS

| | | | | |
|---|---|---|---|---|
| 8,951,661 B2 | 2/2015 | Lev | | |
| 2004/0009334 A1 * | 1/2004 | Miyamoto | .............. | H01M 2/26 428/209 |

(Continued)

FOREIGN PATENT DOCUMENTS

| | | |
|---|---|---|
| JP | 2004095357 A * | 3/2004 |

*Primary Examiner* — Gregg Cantelmo

(74) *Attorney, Agent, or Firm* — Quinn IP Law

(57) ABSTRACT

A method of assembling a power module includes placing a first plurality of cells adjacent to one another to form a first cell layer. A flexible circuit layer is positioned above the first cell layer, the flexible circuit being electrically conductive. A second plurality of cells is positioned adjacent to one another to form a second cell layer aligned with the first cell layer such that the flexible circuit layer is sandwiched between the first cell layer and the second cell layer. The flexible circuit layer is folded along each of a plurality of axes of rotation such that each one of the first plurality of cells faces another one of the second plurality of cells. Each of the first plurality of cells and the second plurality of cells has respective first and second tabs (extending from their respective short ends) which are welded to the flexible circuit layer.

25 Claims, 7 Drawing Sheets

(56) References Cited

U.S. PATENT DOCUMENTS

| | | | | |
|---|---|---|---|---|
| 2005/0250005 | A1* | 11/2005 | Bacon ................. | H01M 2/0207 429/152 |
| 2008/0070102 | A1* | 3/2008 | Watanabe ............... | H01M 2/26 429/91 |
| 2009/0023057 | A1* | 1/2009 | Kim .................... | H01M 2/0207 429/120 |
| 2010/0003594 | A1* | 1/2010 | Hong .................... | H01M 2/021 429/163 |
| 2011/0151300 | A1* | 6/2011 | Herrmann ......... | H01M 10/0413 429/120 |
| 2012/0116189 | A1* | 5/2012 | Jedema ................. | H01M 2/204 600/309 |
| 2012/0315531 | A1 | 12/2012 | Lev et al. | |
| 2013/0011700 | A1* | 1/2013 | Park .................... | H01M 2/1077 429/7 |
| 2015/0050523 | A1* | 2/2015 | Lee ..................... | H01M 2/0212 429/7 |
| 2015/0380697 | A1* | 12/2015 | Osborne ............. | H01M 2/1061 429/91 |

* cited by examiner

METHOD OF ASSEMBLING POWER MODULE VIA FOLDING

INTRODUCTION

The present disclosure relates to a method of assembling a power module via folding. Power modules, such as battery modules, for generating power may be employed in a variety of settings. For example, hybrid vehicles may utilize power modules to energize a motor/generator. Power modules are generally assembled by stacking multiple layers of electrical conductors and insulators.

SUMMARY

A method of assembling a power module includes placing a first plurality of cells adjacent to one another to form a first cell layer. A flexible circuit layer is positioned above the first cell layer, the flexible circuit being electrically conductive. A second plurality of cells is positioned adjacent to one another to form a second cell layer aligned relative to the first cell layer. The flexible circuit layer is configured to be sandwiched between the first cell layer and the second cell layer. The flexible circuit layer is folded along each of a plurality of axes of rotation such that each one of the first plurality of cells faces another one of the second plurality of cells.

Each of the first and second plurality of cells has a respective cell body with respective long ends and respective short ends. Each of the first and second plurality of cells has respective first tabs extending from one of the respective short ends and respective second tabs extending from another of the respective short ends.

The respective first tabs and the respective second tabs of the first plurality of cells and the second plurality of cells may be welded to the flexible circuit layer, prior to the folding or after the folding. The respective first and second tabs may be composed of at least one of the following: aluminum, an aluminum alloy, copper and a copper alloy. The method may include compressing the power module after folding the flexible circuit layer.

In a first embodiment, each of the first plurality of cells is positioned adjacent to one another along their respective short ends. The respective first tabs and the respective second tabs of adjacent ones of the first plurality of cells may be configured to overlap at an overlap zone, such that the respective first tabs and the respective second tabs are welded to the flexible circuit layer at the overlap zone. Alternatively, the respective first tabs and the respective second tabs of adjacent ones of the first plurality of cells may be configured to be spaced by a respective gap. The respective first tabs may be welded to the flexible circuit layer in a first weld zone and the respective second tabs may be welded to the flexible circuit layer in a second weld zone. In this example, the axes of rotation are located at the respective gaps, i.e., the flexible circuit layer may be folded at each of the respective gaps.

In a second embodiment, each of the first plurality of cells is positioned adjacent to one another along their respective long ends. The flexible circuit layer may include respective first and second exposed portions configured to be welded to the respective first and second tabs.

Multiple resilient portions may be placed between the first and the second cell layers such that the multiple resilient portions are co-extensive with the respective cell bodies of the first plurality of cells. The multiple resilient portions are configured to provide a spring force to accommodate an expansion and contraction of the first and second plurality of cells. A heat spreader may be positioned above the first cell layer or below the second cell layer, with the heat spreader being configured to dissipate heat away from the flexible circuit layer.

In a third and a fourth embodiment, the flexible circuit layer includes one or more exposed portions configured to be welded to the respective first and second tabs. The exposed portions may have a substantially arcuate profile. In the third and fourth embodiments, after positioning the second plurality of cells and prior to welding, the method further includes bending the respective first and second tabs in an upwards direction or a downwards direction. In the fourth embodiment, the flexible circuit layer includes a central portion and a plurality of sense lines traces at least partially extending along a perimeter of the central portion. The sense lines traces are electrically isolated from the central portion.

The above features and advantages and other features and advantages of the present disclosure are readily apparent from the following detailed description of the best modes for carrying out the disclosure when taken in connection with the accompanying drawings.

DETAILED DESCRIPTION

Figure 1:
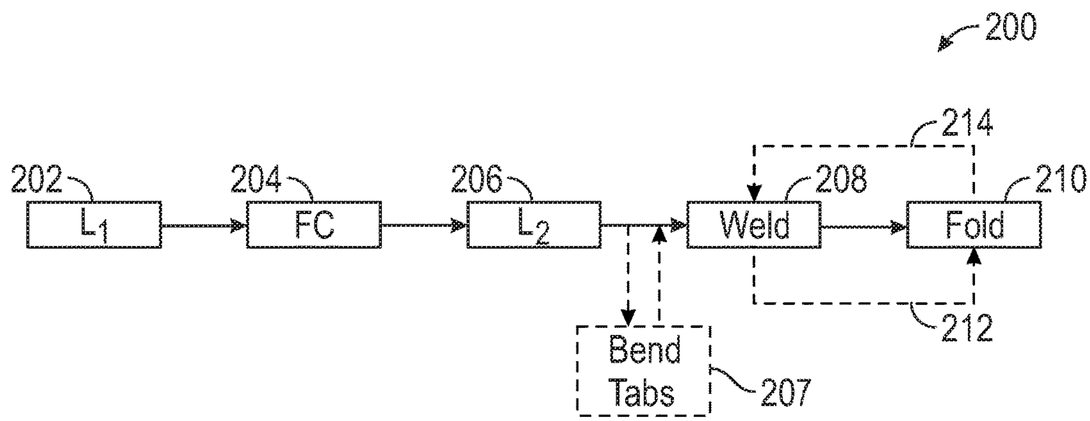
FIG. 1 is a flowchart of a method of assembling a power module.

Referring to the drawings, wherein like reference numbers refer to like components, FIG. 1 illustrates a flowchart of a method 200 of assembling a power module. Power modules are generally assembled by stacking multiple layers of electrical conductors and insulators and then welding the connections of the various layers. Rather than stacking the module and then welding, the method 200 involves layering individual cell groups adjacent to one another and then folding to form the power module. The method 200 streamlines the assembly process and reduces the number of assembly steps, the number of overall parts, and the number of electrical connections to increase reliability.

Method 200 includes blocks 202, 204, 206, 208 and 210 shown in FIG. 1, described below with reference to two embodiments. Method 200 need not be applied in the specific order recited herein and it is understood that some steps may be eliminated.

First Embodiment

Figure 2:
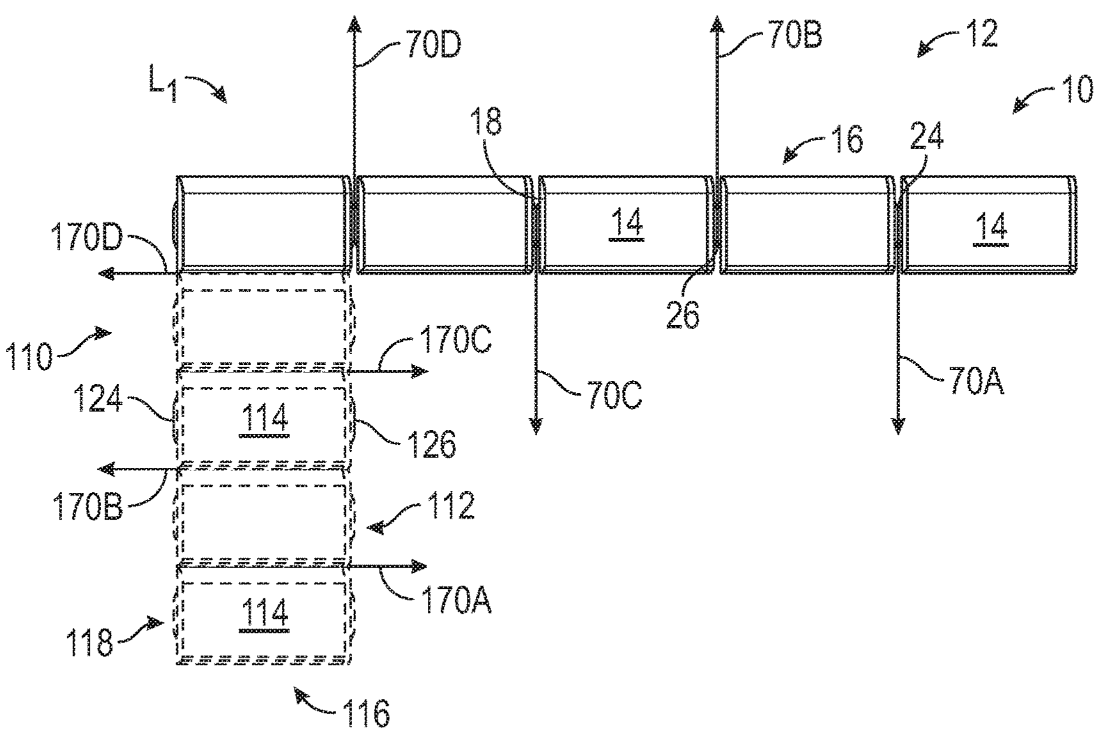
FIG. 2 is a schematic top view of a plurality of cells placed adjacent to one another.

A first embodiment is described with respect to FIGS. 1-2, 3, 5 and 7-8. Per block 202 of FIG. 1, a first plurality of cells 12 is placed adjacent to one another to form a first cell layer ($L_1$). FIG. 2 is a schematic top view of a first plurality of cells 12 placed adjacent to one another. The first plurality of cells 12 may be pouch-type cells, including but not limited to, lithium manganese, lithium ion phosphate, lithium cobalt, lithium nickel based cells. Referring to FIG. 2, each of the first plurality of cells 12 has a respective cell body 14 with at least two respective long ends 16 and at least two respective short ends 18. In the first embodiment, the first plurality of cells 12 are positioned adjacent to one another along their respective short ends 18.

Referring to FIG. 2, each of the first plurality of cells has a respective first tab 24 extending from one of the short ends 18 and a respective second tab 26 extending from another of the respective short ends 18. The respective first and second tabs 24, 26 are configured to be electrically conductive and may be composed of at least one of the following: aluminum, an aluminum alloy, copper and a copper alloy. In cell terms, the first tab and second tab may be referred to as cathode and anode (or vice-versa). The cathode may be composed of aluminum (positive) and anode may be composed of copper (negative).

Figure 3:
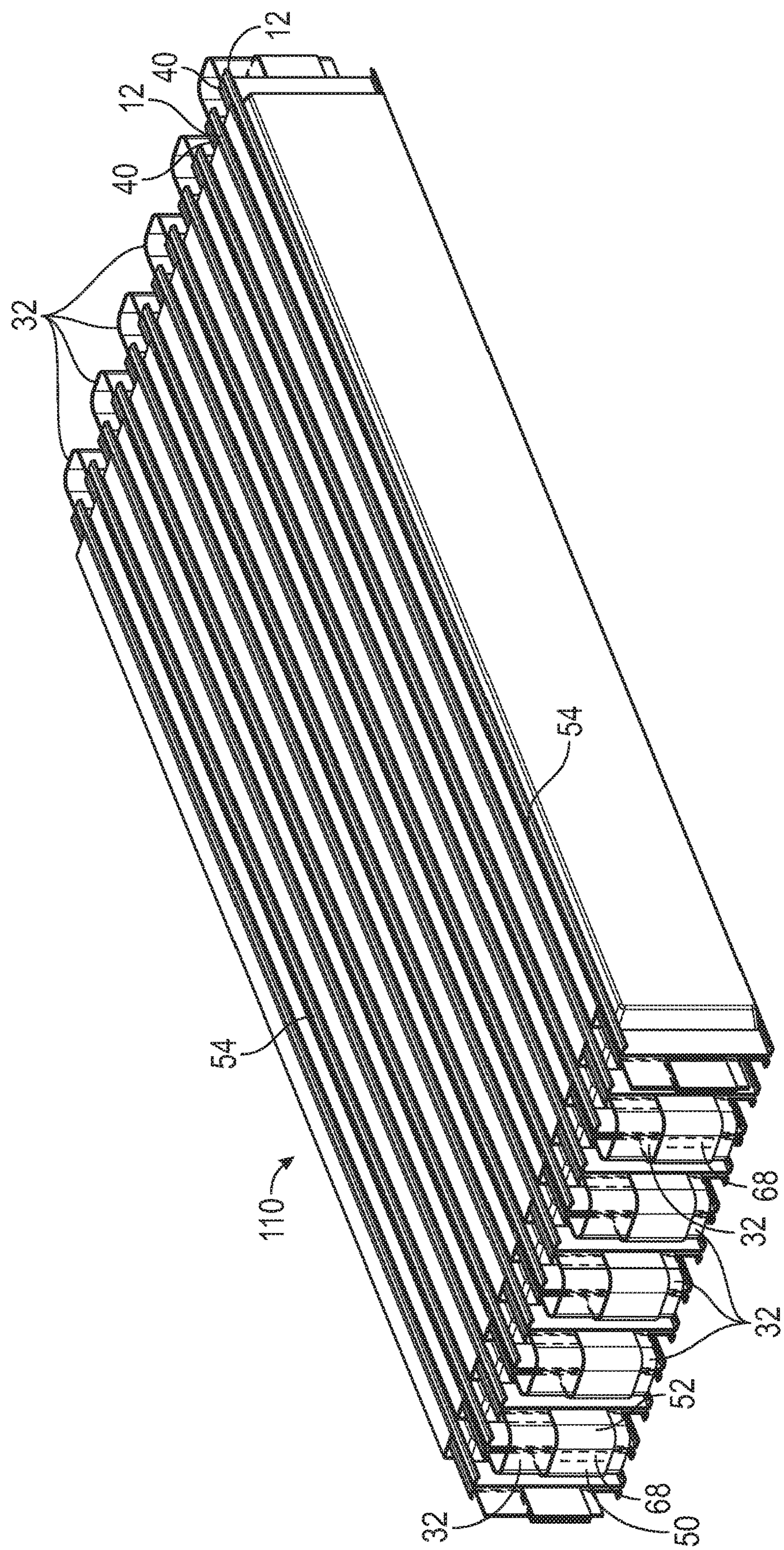
FIG. 3 is a schematic perspective view of a finished power module, in accordance with a first embodiment.
Figure 5:
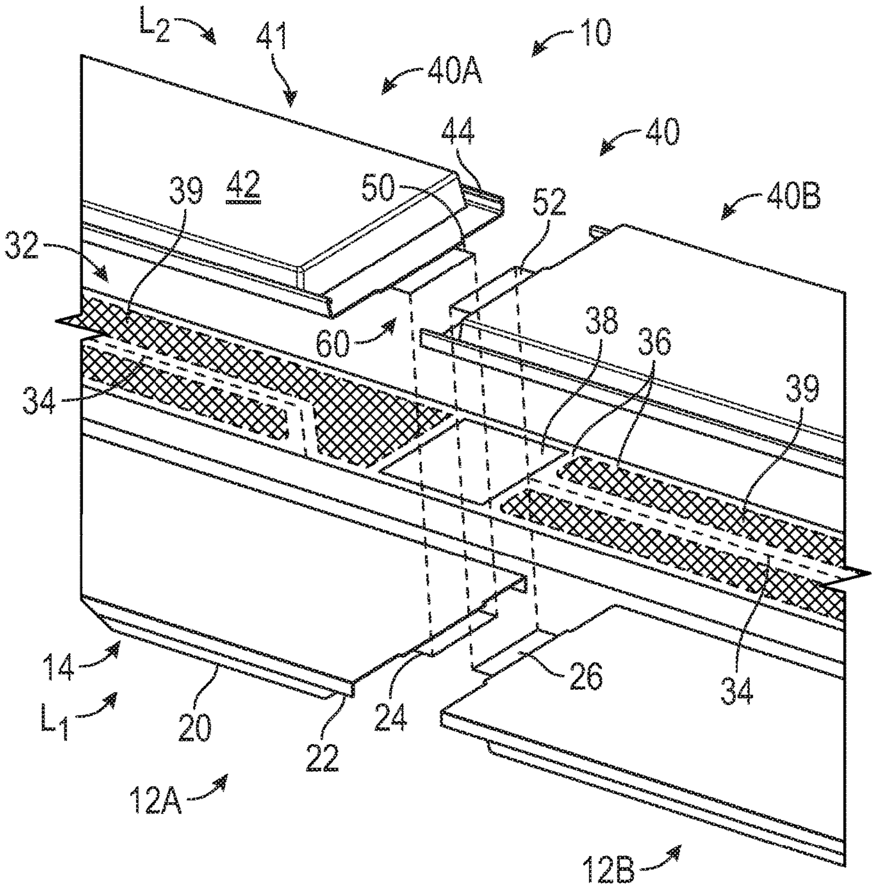
FIG. 5 is a schematic fragmentary exploded view of a portion of the power module of FIG. 3, during assembly.

FIG. 3 shows a power module 10 after assembly. The power module 10 may take many different forms and include multiple and/or alternate components. An example of a first cell 12A adjacent to a second cell 12B of the first plurality of cells 12 is shown in the exploded fragmentary view of FIG. 5. Referring to FIG. 5, the cell body 14 of the first cell 12A may include a chemical element 20 operatively connected to a sealed base 22. The first tab 24 of the first cell 12A is shown as well as the second tab 26 of the second cell 12B.

Per block 204 of FIG. 1 and as shown in FIG. 5, a flexible circuit layer 32 is positioned above the first cell layer ($L_1$). The flexible circuit layer 32 is configured to be electrically conductive and provide cell voltage sensing relative to the first plurality of cells 12. Referring to FIG. 5, the flexible circuit layer 32 includes a pattern of conductive traces 34, including but not limited to sense line traces, bonded to a flexible substrate 36. The conductive traces 34 may be formed by etching metal foil (such as aluminum or copper), plating metal, printing of conductive inks, laser imaging, photo imaging and other processes employed by those skilled in the art. To improve structural integrity, the flexible substrate 36 may include cross-hatching areas 39. The cross-hatching areas 39 may be used for heat spreading as well across the faces of the first cell layer ($L_1$). The flexible circuit layer 32 is capable of being sufficiently bent or folded. The flexible circuit layer 32 may include a polymeric insulation film (including but not limited to polyimide, PET and PEN) to insulate the conductive traces 34 from environmental exposure. The polymeric insulation film may be intrinsic to the flexible circuit layer 32.

Referring to FIG. 5, the respective first and second tabs 24, 26 may be offset to one end (in a vertical direction) of the cell body 14. However, the respective first and second tabs 24, 26 may be positioned in the center (in a vertical direction) of the cell body 14 or in the opposite end (i.e. extending from the bottom of chemical element 20). The advantage of utilizing an offset position is that the cell tabs (such as the respective first and second tabs 24, 26) can be brought in close proximity to the welding areas (e.g. the weld region 68 shown in FIG. 8 and described below) of the flexible circuit layer 32 without bending the cell tabs.

Per block 206 of FIG. 1 and as shown in FIG. 5, a second plurality of cells 40, such as third cell 40A and fourth cell 40B, is positioned adjacent to one another (along their respective short ends 48 labeled in FIG. 7) to form a second cell layer ($L_2$) coextensive with the first cell layer ($L_1$). Similar to the first plurality of cells 12, the second plurality of cells 40 may be pouch-type cells, including but not limited to, lithium manganese, lithium ion phosphate, lithium cobalt, lithium nickel based cells. The second cell layer ($L_2$) is positioned such that the flexible circuit layer 32 is sandwiched between the first cell layer ($L_1$) and the second cell layer ($L_2$). Referring to FIG. 5, the respective cell bodies 14 of the first cell layer ($L_1$) are aligned (i.e., co-extensive with) with the respective cell bodies 41 of the second cell layer ($L_2$). Referring to FIG. 5, the first and second cell layers ($L_1$, $L_2$) are oriented such that the cathode (e.g. first tab 50) of cell 40A is aligned with the cathode (e.g. first tab 24) of cell 12A and the anode (e.g. second tab 52) of cell 40B is aligned with the anode (e.g. second tab 26) tab of cell 12B.

Additionally, per block 206 of FIG. 1, multiple resilient portions 54 (shown lightly shaded in FIG. 8) may be placed between the first and the second cell layers ($L_1$, $L_2$) such that the multiple resilient portions 54 extend over the respective cell bodies 14 of the first plurality of cells 12. The multiple resilient portions 54 (see also FIG. 3) are configured to provide a spring force to accommodate an expansion and contraction of the first and second plurality of cells 12, 40. In one embodiment, the multiple resilient portions 54 are individual pieces. In another embodiment, the multiple resilient portions 54 are part of a single continuous sheet of foam, with die-cut areas (or "windows") where the cell tabs are welded together.

Figure 8:
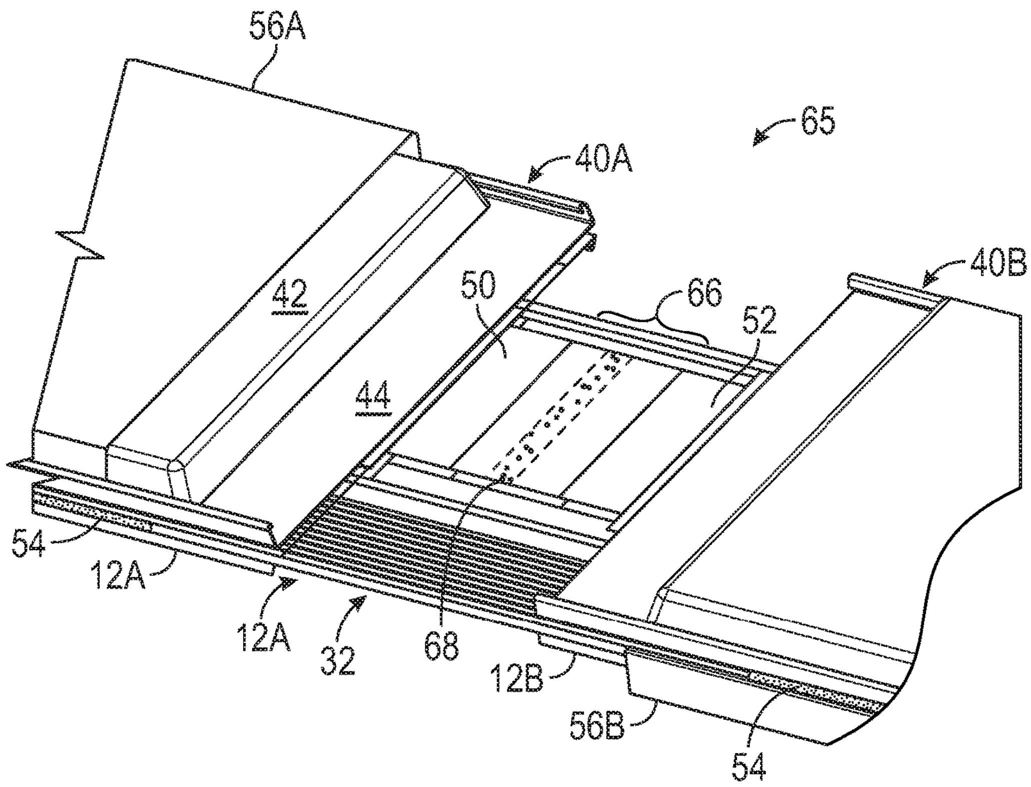
FIG. 8 is a schematic fragmentary perspective view of an alternative cell tab joint, in accordance with the first embodiment.

Furthermore, the power module 10 may include a plurality of heat spreaders 56A, 56B (see FIG. 8) configured to dissipate heat away from the flexible circuit layer 32 to a heat sink (not shown). Referring to FIG. 8, the heat spreader 56A is positioned above the third cell 40A (i.e., above the second cell layer ($L_2$)) and the heat spreader 56B is positioned below the second cell 12B (i.e., below the first cell layer ($L_1$)). In one example, the heat spreaders 56A, 56B are placed in an alternating pattern, above the second cell layer ($L_2$) of each even cell group and below the first cell layer ($L_1$) of each odd cell group. The heat spreaders 56A, 56B may be configured to dissipate or spread heat from the cell face directly, without touching the flexible circuit layer 32. The heat spreaders 56A, 56B may be shaped as a C-channel plate.

Figure 7:
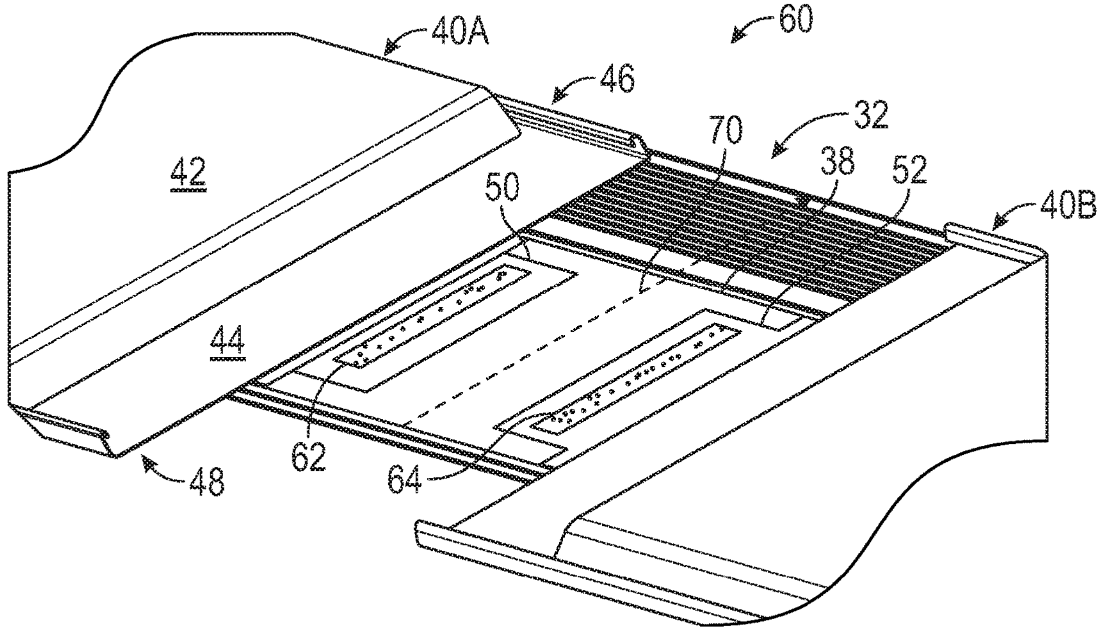
FIG. 7 is a schematic fragmentary perspective view of a cell tab joint, in accordance with the first embodiment.

Per block 208 of FIG. 1 and as shown in FIG. 5, the respective first and second tabs 24, 26 of adjacent cells in the first cell layer ($L_1$) and the respective first and second tabs 50, 52 of adjacent cells in the second cell layer ($L_2$) are aligned with and welded to the flexible circuit layer 32. Referring to FIGS. 5 and 7, the respective first and second tabs 24, 26, 50, 52 may be welded to the flexible circuit layer 32 at an exposed portion 38 that is a double-sided exposed metal, i.e., has exposed metal on opposing sides facing each of the respective first and second tabs 24, 26, 50, 52. The exposed portion 38 may be intrinsically connected to traces 34 as part of the flexible circuit patterning process noted above. By welding to the exposed portion 38, both the high current connection and the low-voltage connection may be made simultaneously.

Referring to FIG. 5, the respective cell bodies 14 of the first cell layer ($L_1$) are aligned with the respective cell bodies 41 of the second cell layer ($L_2$). The welding may be done ultrasonically using a single axis weld system. For example, a stationary weld station (not shown) actuating in a single direction may be employed. The welding operatively connects the conductive traces 34 of the flexible circuit layer 32 and the respective first and second tabs 24, 26, 50, 52 in one step. This allows for sensing cell voltage and balancing cell groups in conjunction with a battery management system. In other words, no bus bars (such as U-shaped, stamped channels) are required to carry current between cell tabs. Additionally, no secondary operations or electrical joints, such as riveting, soldering, resistance welding or facsimile are required to connect voltage sense circuitry.

FIG. 7 is a schematic fragmentary perspective view of a cell tab joint 60 between adjacent cells of the second plurality of cells 40, e.g., the third cell 40A and fourth cell 40B. FIG. 8 is a schematic fragmentary perspective view of an alternative cell tab joint 65 between the third cell 40A and fourth cell 40B. Referring to FIGS. 5, 7 and 8, each of the second plurality of cells 40 has a respective cell body 41 with at least two respective long ends 46 (see FIG. 7) and at least two respective short ends 48 (se FIG. 7). Referring to FIGS. 5, 7 and 8, the respective cell body 41 may include a chemical element 42 operatively connected to a sealed base 44 (see FIGS. 5, 7 and 8).

Referring to FIGS. 5, 7 and 8, each of the second plurality of cells 40 has a respective first tab 50 extending from one of the short ends 48 (see FIG. 7) and a respective second tab 52 extending from another of the respective short ends 48 (see FIG. 7). The respective first and second tabs 50, 52 are configured to be electrically conductive and may be composed of at least one of the following: aluminum, an aluminum alloy, copper and a copper alloy.

The respective first and second tabs 50, 52, may be configured to be spaced apart from one another, as shown in FIG. 5 and FIG. 7. Referring to FIG. 7, the respective first tabs 50 may be welded to the flexible circuit layer 32 in a first weld zone 62 (lightly shaded in FIG. 7) and the respective second tabs 52 may be welded to the flexible circuit layer 32 in a second weld zone 64 (lightly shaded in FIG. 7).

Alternatively, the respective first tabs 50 and the respective second tabs 52 may be configured to overlap at an overlap zone 66, as shown in FIG. 8. Referring to FIG. 8, the respective first and second tabs 50, 52 may be welded to the flexible circuit layer 32 at the portion of the overlap zone 66, such as weld region 68 (lightly shaded in FIG. 8). The technical advantage here is that the flexible circuit layer 32 does not have to carry the main circuit load and there is only one cell tab joint instead of two, lowering the overall resistance.

Per block 210 of FIG. 1, the flexible circuit layer 32 is folded along each of a plurality of axes of rotation, such as axes 70A, 70B, 70C and 70D shown in FIG. 2, such that each one of the first plurality of cells 12 faces another one of the second plurality of cells 14. Other parts of the assembly 10, such as the multiple resilient portions 54 and the cell tabs may be folded as well. FIG. 3 shows the power module 10 after the folding process. Referring to FIG. 2, neighboring or adjacent cell groups may be brought together by folding about alternating axes, such that the axes 70A and 70C are opposite to the axes 70B and 70D. The folding may be winding fold, a Z fold (forming letter Z in a profile view) or other folding sequence suitable for the application at hand.

To assist the folding process, a pressure-sensitive adhesive or transfer tape or other attachment method may be employed to adhere the flexible circuit layer 32 to the first and second cell layers ($L_1$ $L_2$) and vice-versa. The adhesive may be applied locally (for example just the first and last cell or some combination of cells, or along the entire length).

In the example shown in FIG. 7, at least the flexible circuit layer 32 is bent at the axis of rotation 70. The respective first and second tabs 50, 52 may also be bent to some degree. The axis of rotation 70 may be the midpoint between the respective first and second tabs 50, 52 of the second cell layer ($L_2$) (which is the same as the midpoint of the first and second tabs 24, 26 of the first cell layer ($L_1$) since they are aligned). In the example shown in FIG. 8, the flexible circuit layer 32 along with a portion of the overlap zone 66 is also bent. After folding, the power module 10 may be compressed in order to improve packaging efficiency and to maximize the life of the cell.

Second Embodiment

Figure 4:
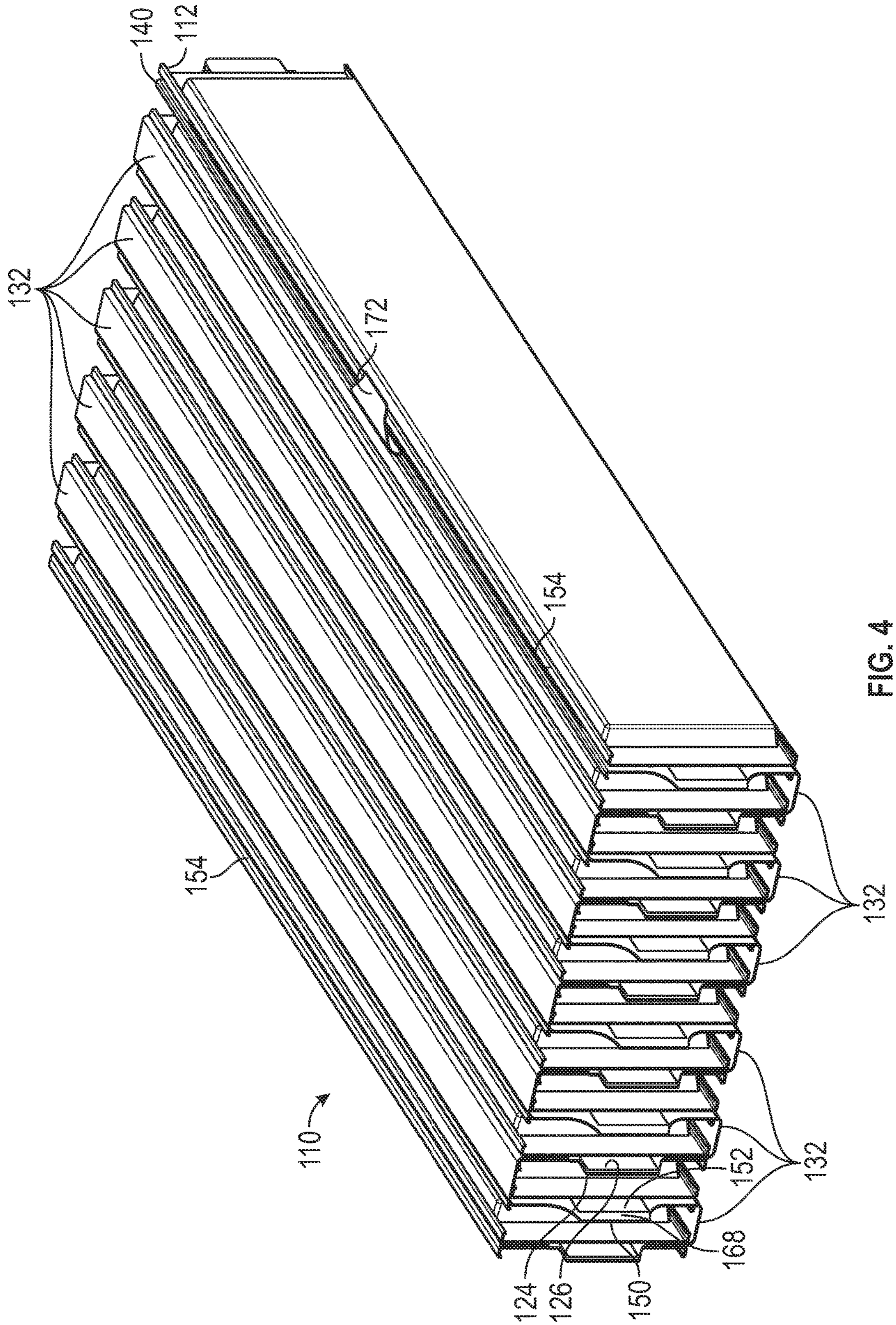
FIG. 4 is a schematic perspective view of a finished power module, in accordance with a second embodiment.
Figure 6:
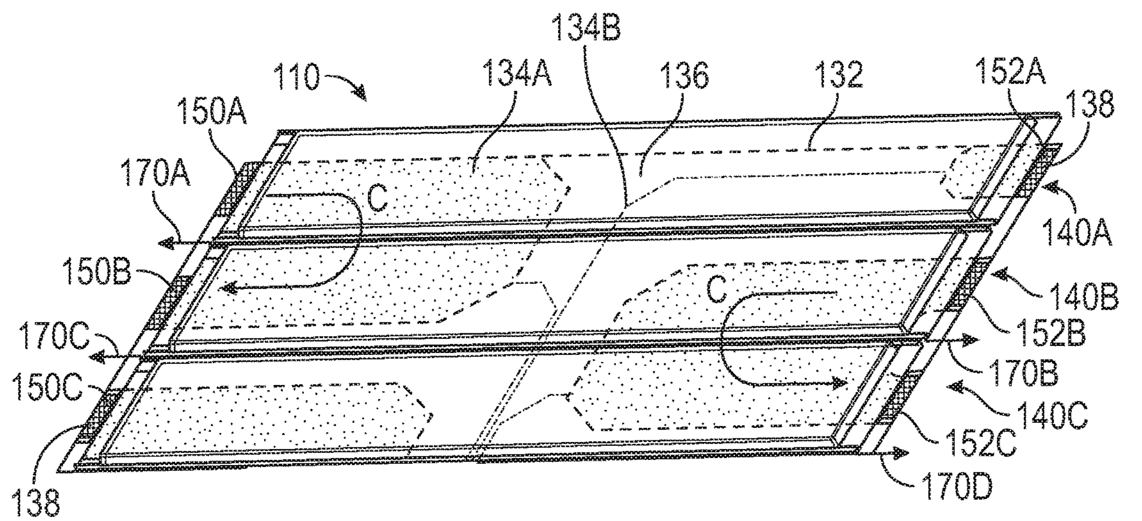
FIG. 6 is a schematic fragmentary perspective view of a portion of the power module of FIG. 4, during assembly.

A second embodiment is described with respect to FIGS. 1-2, 4 and 6. The second embodiment is similar to the first embodiment, except for the differences outlined below. FIG. 4 shows a power module 110 after assembly. The power module 110 may take many different forms and include multiple and/or alternate components. FIG. 6 is a schematic fragmentary perspective view of a portion of the power module 110, during assembly.

Per block 202 of FIG. 1 and as shown in phantom in FIG. 2, a first plurality of cells 112 is positioned adjacent to one another to form the first cell layer ($L_1$). Referring to FIG. 2, the first plurality of cells 112 includes respective cell bodies 114 with respective long ends 116 and respective short ends 118. In the second embodiment, each of the first plurality of cells 112 is positioned adjacent to one another along their respective long ends 116 (as opposed to the respective short ends in the first embodiment). Referring to FIG. 2, the first plurality of cells 112 includes first and second tabs 124, 126 extending from the respective short ends 118. The first plurality of cells 112 may be pouch-type cells, including but not limited to, lithium manganese, lithium ion phosphate, lithium cobalt, lithium nickel based cells.

Similar to the first embodiment, per block 204 of FIG. 1, a flexible circuit layer 132 (see FIG. 6) is positioned above the first cell layer ($L_1$) (see FIG. 2). The flexible circuit layer 132 is configured to be electrically conductive and provide cell voltage sensing from respective positive and negative cell tab joints to a separate voltage sense circuit or battery management system (not shown). Referring to FIG. 6, the flexible circuit layer 132 includes a pattern of conductive traces 134 bonded to a flexible substrate 136. The flexible circuit layer 132 is capable of being sufficiently bent or folded and may be composed of a polymer or plastic. Referring to FIG. 6, the conductive traces 134 include sense line traces 134B (low-voltage) and a main current portion 134A configured to connect cells. The main current portion 134A is configured to be of sufficient size to handle the electrical load. The high current path indicated by "C" is the high current bus between neighboring cell tabs. In the embodiment shown, neighboring cell tabs are not directly joined except through the flexible circuit layer 132. The conductive traces 134 may be crimped or otherwise terminated at the ends of the power module 110.

The flexible circuit layer 132 includes a plurality of exposed portions 138 (cross-hatched in FIG. 6) configured to be welded to the respective first and second tabs 124, 126. The exposed portions 138 may be double-sided exposed metals, that is, they may have exposed metal on both sides. Referring to FIG. 8, the respective first and second tabs 50, 52 may be welded to the flexible circuit layer 32 at the portion of the overlap zone 66, such as weld region 68. In one embodiment, a connector 172, such as an insulation displacement type or ZIF-type, (see FIG. 4) may be employed to carry the current away from the power module 110. In another embodiment, a secondary soldering operation may be employed. Alternatively, if the end of the flexible circuit layer 134 has exposed terminals (at least on one side) the flexible circuit layer 132 may be directly inserted to an appropriate receptacle on a circuit board designed to receive the flex circuit terminals.

Per block 206 of FIG. 1, a second plurality of cells (such as the fourth, fifth, and sixth cells 140A, 140B and 140C shown in FIG. 6) is positioned adjacent to one another to form a second cell layer ($L_2$) coextensive with the first cell layer ($L_1$). Referring to FIG. 6, the third cell 140A has respective first and second tabs 150A, 152A. The fourth cell 140B has respective first and second tabs 150B, 152B and the fifth cell 140C has respective first and second tabs 150C, 152C. The flexible circuit layer 132 is sandwiched by the second cell layer ($L_2$) and the first cell layer ($L_1$).

Also per block 206, multiple resilient portions 154 (see FIG. 4) may be placed between the first and the second cell layers ($L_1$, $L_2$) such that the multiple resilient portions 154 extend over the respective cell bodies 114 of the first plurality of cells 112. The multiple resilient portions 154 are configured to provide a spring force to accommodate an expansion and contraction of the first and second plurality of cells 112, 140 (see FIG. 4). The assembly 110 may include one or more heat spreaders, such as the heat spreaders 56A, 56B shown in FIG. 8, configured to dissipate or spread heat. In the second embodiment, the flexible circuit layer 132 itself functions as a heat spreader. A cooling plate (not shown) may be placed in contact with the heat spreaders to provide thermal transfer from the cell face, in effect, cooling the high current path "C" in FIG. 6. The heat spreaders 56A, 56B, shown in FIG. 8, may take various forms and may be selected based on the application.

Per block 208 of FIG. 1, the respective first and second tabs 124, 126 (see FIG. 2) of adjacent cells in the first cell layer ($L_1$) and the respective first and second tabs 150, 152 (see FIG. 4) of adjacent cells in the second cell layer ($L_2$) are aligned with and welded to the flexible circuit layer 132. The welding (see weld region 168 in FIG. 4) may be done ultrasonically using a single axis weld system. For example, a stationary weld station (not shown) actuating in a single direction may be employed. In both the first and second embodiments, the technical advantage is that the connections of the respective first and second tabs 124, 126, 150, 152 (FIG. 4) and low-voltage sensing connections of the flexible circuit layer 132 may be completed in the same weld station simultaneously.

In the first embodiment, the welding of block 208 occurs prior to the folding of block 210. However, in the second embodiment, the welding of block 208 may occur either prior to the folding of block 210 or after it (as shown by dashed lines 212, 214 in FIG. 1).

Per block 210 of FIG. 1, the flexible circuit layer 132 is folded along each of a plurality of axes of rotation, such as axes 170A, 170B, 170C and 170D shown in FIG. 2. FIG. 4 shows the power module 110 after the folding process. Referring to FIG. 2, neighboring or adjacent cell groups may be brought together by folding about alternating axes, such that the axes 170A and 170C are opposite to the axes 170B and 170D.

Thus, the flexible circuit layers 32, 132 enable a folding process for assembling a power module 10, 110, respectively. The cell groups are lined end-to-end in a conveyor strip fashion with the flexible circuit layer 32, 132 residing between the cell faces. The cell groups may be indexed in conveyor form into a stationary weld station (not shown). Once the module electrical connections are completed (or prior to), a folding process occurs in which neighboring cell groups are brought together to assemble the power module 10, 110 for packaging. The method 200 results in process improvements (reduction of process steps and number of interconnections), improved reliability and reduction of mass.

Third Embodiment

Figure 9:
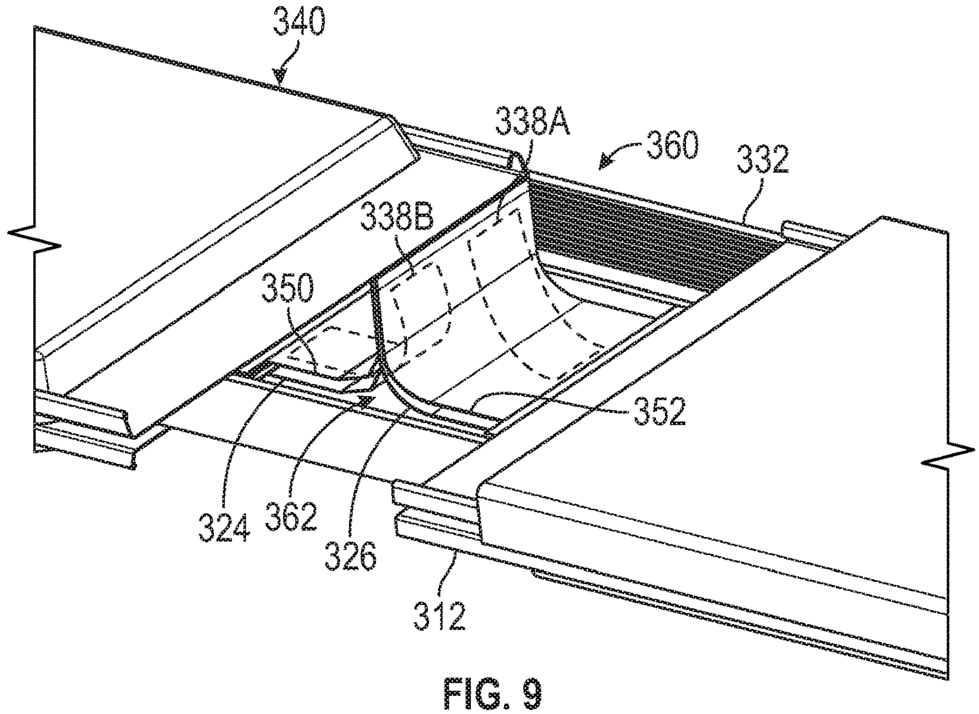
FIG. 9 is a schematic fragmentary perspective view of a cell tab joint, prior to folding, in accordance with a third embodiment.
Figure 10:
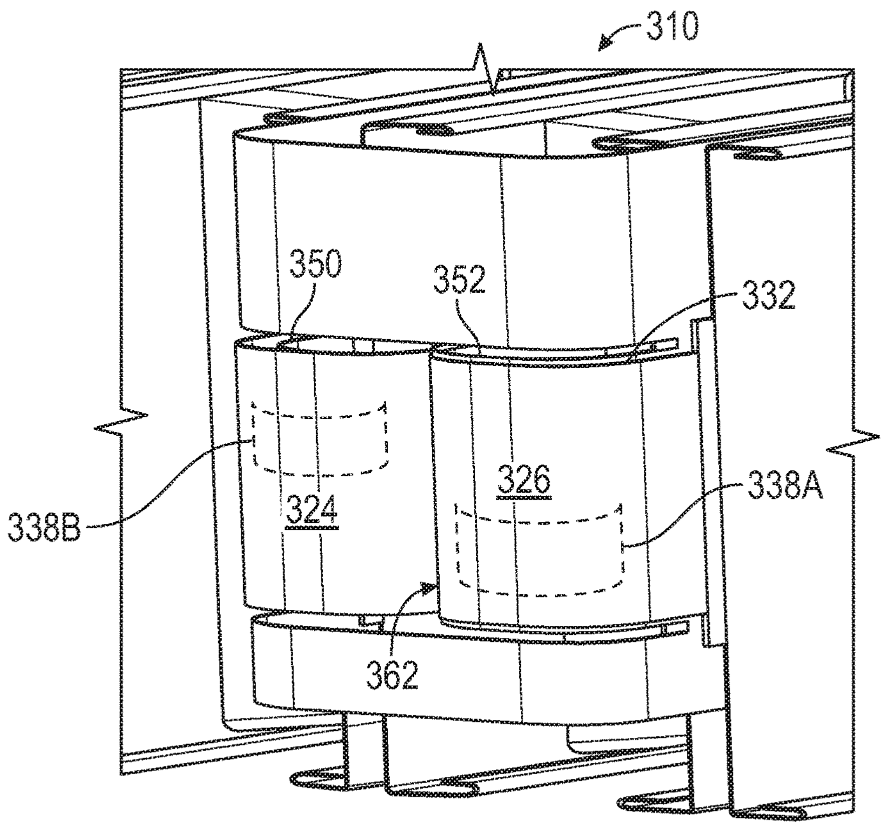
FIG. 10 is schematic fragmentary perspective view of the cell tab joint of FIG. 9, after folding.

The third embodiment is described with respect to FIGS. 9-10. The arrangement is similar to the first embodiment, except for the differences described below. FIG. 9 shows a portion of a cell tab joint 360. Referring to FIG. 9, the flexible circuit layer 332 is configured to have at least one exposed portion (for example, see exposed portions 338A, 338B shown in dashed lines in FIG. 9) that is a "flying lead" or "finger" instead of a flat area. The exposed portions 338A, B have exposed metal (or another electrical conductor) on all of their surfaces. The feature may be created by cutting a "window" in the flexible circuit layer 332 or removing the supporting insulation layers above and below the respective areas. The exposed portions 338A, B may have a substantially arcuate profile.

Referring to FIGS. 9-10, the exposed portions 338A, 338B ("flying lead") of the flexible circuit layer 332 are captured between cell tabs (respective first and second tabs 324, 326, 350 and 352). The size, shape and location of the exposed portions 338A, B (relative to the cell tabs) may be varied based on the particular application. It is to be understood that the cell tab joint 360 may include a single exposed portion residing between two aluminum cell tabs or multiple exposed portions configured to reside between copper cell tabs or copper and aluminum cell tabs. The technical advantage with multiple exposed portions is redundancy and durability, in that multiple sense lines are used at the cell tab joint 360 instead of one.

The third embodiment includes an additional step of bending the cell tabs and the flexible circuit layer 332 together, as shown in block 207 of FIG. 1. The cell tabs may be bent in block 207 after the first and second plurality of cells 312, 340 (see FIG. 9) has been positioned as in the first embodiment per block 206 (along their respective short ends). The cell tabs may be bent individually prior to being placed in the first and second cell layers ($L_1$, $L_2$). Accordingly, block 207 in FIG. 1 may optionally be placed at the beginning, prior to block 202. The cell tabs may be bent either upwards or downwards. The third embodiment allows the cell tabs to bend independently from the remaining components. Welding per block 208 may be done as before with a single axis weld system, prior to folding. In this embodiment, the exposed portions 338A, B may be bent along with the cell tabs.

FIG. 10 shows the power module 310 after folding per block 210 of FIG. 1. FIG. 9 show the cell tabs as being bent upwards and defining a crevice 362. An alternating arrangement can be made such that every other cell tab joint 360 has bends in opposing directions, for example, the odd cell joints may be bent up and the even cell joints may be bent down. The third embodiment produces a potentially more low-profile package than the first embodiment, as the cell tabs are bent inward, i.e., with the crevice 362 facing the exterior side.

Fourth Embodiment

Figure 11:
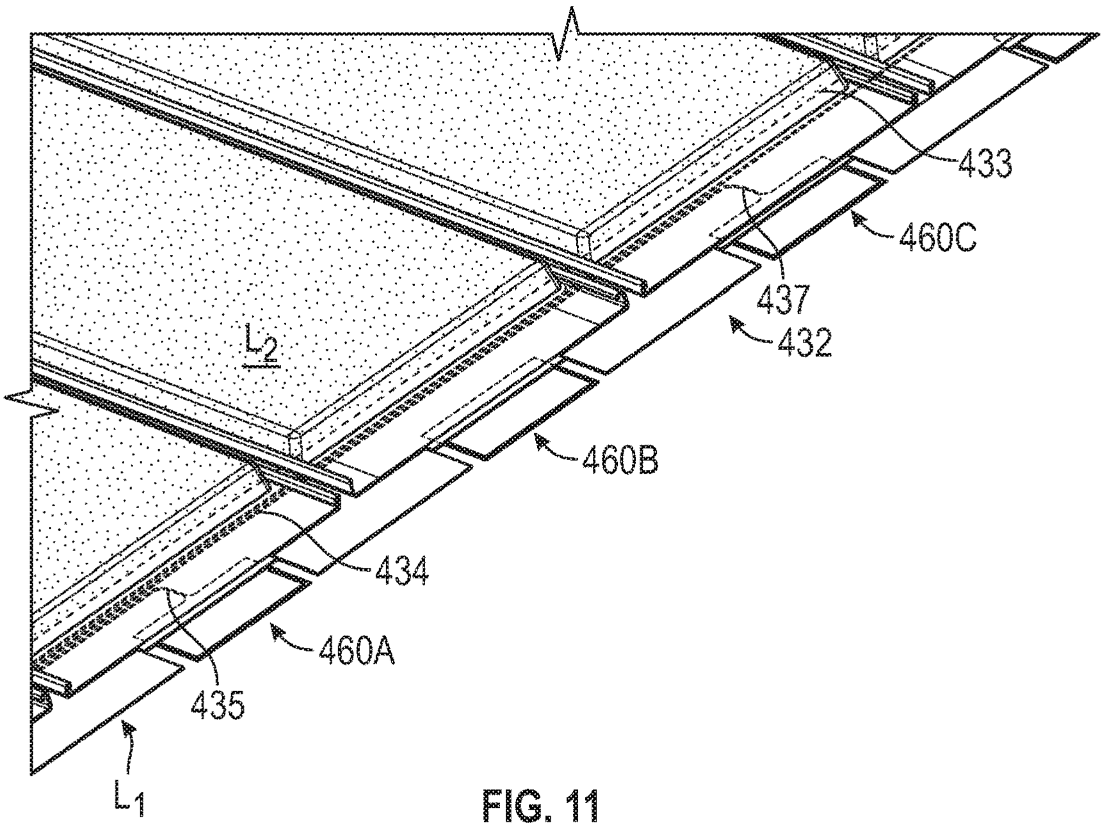
FIG. 11 is a schematic perspective view of a portion of a power module, prior to bending, in accordance with the fourth embodiment.
Figure 12:
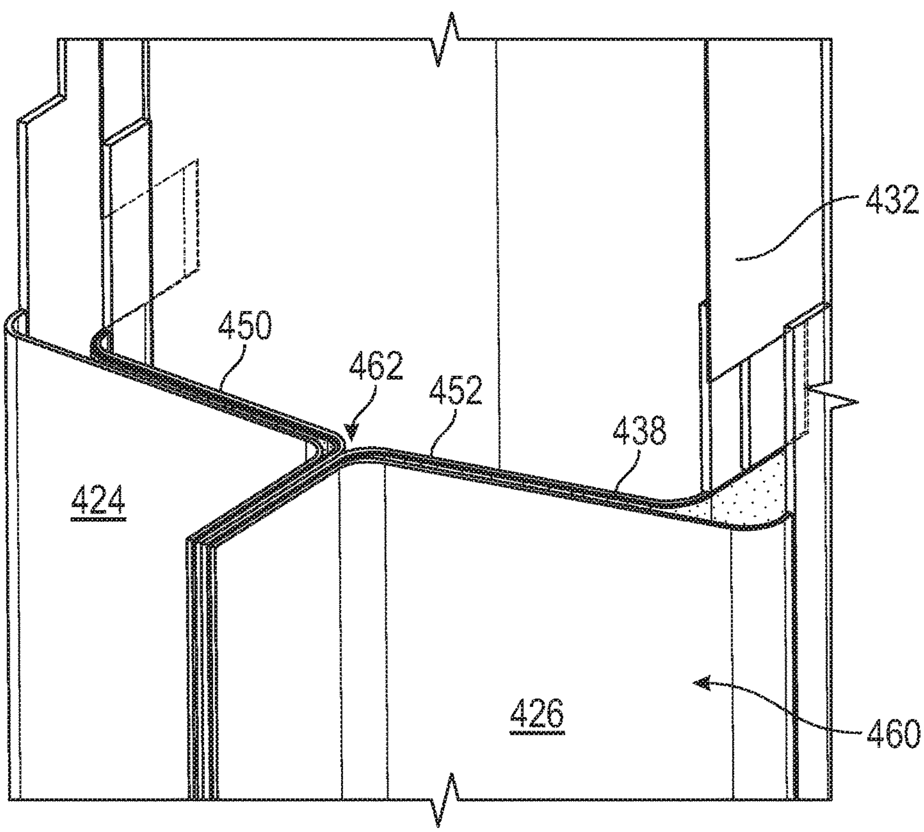
FIG. 12 is a schematic perspective view of a portion of the power module of FIG. 11, after bending.

The fourth embodiment is described with respect to FIGS. 11-12. The arrangement is similar to the second and third embodiments, except for the differences described below. Referring to FIG. 11 and as in the second embodiment, the first and the second cell layers ($L_1$, $L_2$) are positioned along their respective long ends. Similar to the third embodiment, the fourth embodiment includes an additional step of bending the cell tabs and the flexible circuit layer 432 together, shown in block 207 of FIG. 1.

FIG. 11 shows multiple cell tab junctions 460A-C prior to the cell tabs (respective first and second tabs 424, 426, 450, 452, see FIG. 12) being bent. FIG. 12 represents a close-up view of the finished bent and welded cell tabs (after folding). Per block 207 of FIG. 1, the cell tabs may be bent either upwards or downwards. Similar to the third embodiment, the cell tabs may be bent either prior to or after being positioned in the first and the second cell layers ($L_1$, $L_2$).

An alternating arrangement can be made such that every other cell tab joint 460 has bends in opposing directions, for example, the odd cell joints 460 may be bent up and the even cell joints 460 may be bent down. This enables the cell tabs to be joined directly during or after folding per block 210 (of FIG. 1). This is a technical advantage as the flexible circuit layer 432 is no longer relied on to carry high current loads as in the second embodiment. Welding, per block 208 of FIG. 1, may be done as before with a single axis weld system, after folding per lines 212 and 214 of FIG. 1.

The pattern of the flexible circuit layer 432 is different from the second embodiment, namely the high current path "C" (see FIG. 6) is no longer present. Instead, the center of the flexible circuit layer 432 is replaced by a sheet, which may be a solid or semi-solid cross-hatched sheet, for the purpose of heat transfer between the cell face and adjoining cooling systems (not shown). Referring to FIG. 11, the flexible circuit layer 432 includes a central portion 433 (shown with shading) and sense line traces 434 (low-voltage) extending or travelling along a perimeter of the central portion 433. The sense line traces 434 are electrically isolated from the central portion 433. The central portion 433 may be composed of a solid or semi-solid cross-hatched sheet.

Referring to FIG. 12 and similar to the third embodiment, the flexible circuit layer 432 includes at least one exposed portion 438 that is a "flying lead" or "finger" instead of a flat area. This enables more flexibility with how the cell tabs are folded (block 210) in the method 200. The size, shape and location (relative to the cell tabs) of the exposed portion 438 may be varied based on the particular application. It is to be noted that not all cell tab joints 460 require access to the flexible circuit layer 432 in this embodiment. The exposed portions 438 or "flying leads" may be formed in the flexible circuit layer 432 at selected cell tab locations.

In the embodiment shown in FIG. 11, cell tab joints 460A and 460C are connected to sense line traces 434 via lines 435 and 437, respectively, however cell tab joint 460B is not. The reason is that, in the final form, cell tab joints 460A are joined directly to cell tab joint 460B, while cell tab joint 460C is joined to cell tab joint 460D. Thus the cell tab joints 460A, B are at the same voltage, while cell tab joints 460C, D are at another voltage. Only one of cell tab joints 460A, 460B is required to be connected to a sense line trace 434 for the design to function. However, both cell tab joints 460A and 460B may be connected to individual sense line traces 434 for redundancy and additional reliability.

The detailed description and the drawings or figures are supportive and descriptive of the disclosure, but the scope of the disclosure is defined solely by the claims. While some of the best modes and other embodiments for carrying out the claimed disclosure have been described in detail, various alternative designs and embodiments exist for practicing the disclosure defined in the appended claims. Furthermore, the embodiments shown in the drawings or the characteristics of various embodiments mentioned in the present description are not necessarily to be understood as embodiments independent of each other. Rather, it is possible that each of the characteristics described in one of the examples of an embodiment can be combined with one or more desired characteristics from other embodiments, resulting in other embodiments not described in words or by reference to the drawings. Accordingly, such other embodiments fall within the framework of the scope of the appended claims.

What is claimed is:

1. A method of assembling a power module, the method comprising:

placing a first plurality of cells adjacent to one another to form a first cell layer;

positioning a flexible circuit layer above the first cell layer, the flexible circuit being electrically conductive;

positioning a second plurality of cells adjacent to one another to form a second cell layer aligned relative to the first plurality of cells;

sandwiching the flexible circuit layer between the first cell layer and the second cell layer;

placing a plurality of heat spreaders in an alternating pattern directly outward of the first plurality of cells and the second plurality of cells, the plurality of heat spreaders including a first heat spreader and a second heat spreader;

wherein the alternating pattern is such that the first heat spreader is positioned directly outward of one of the first plurality of cells and the second heat spreader is positioned directly outward of an adjacent one of the second plurality of cells;

wherein the plurality of heat spreaders is configured to dissipate heat away from the flexible circuit layer; and folding the flexible circuit layer along each of a plurality of axes of rotation such that at least one of the first plurality of cells directly faces another one of the first plurality of cells and at least one of the second plurality of cells directly faces another one of the second plurality of cells.

2. The method of claim 1, wherein:

each of the first plurality of cells and the second plurality of cells has a respective cell body with respective long ends and respective short ends, the respective cell bodies of the first and the second plurality of cells being aligned;

each of the first and the second plurality of cells has respective first tabs extending from one of the respective short ends and respective second tabs extending from another of the respective short ends; and the method further includes welding the respective first tabs and the respective second tabs of the first plurality of cells and the second plurality of cells to the flexible circuit layer to form respective cell tab joints.

3. The method of claim 2, further comprising:

compressing the power module after folding the flexible circuit layer.

4. The method of claim 1, wherein the plurality of heat spreaders are C-channel plates.

5. The method of claim 1, further comprising:

configuring the flexible circuit layer with a central portion and a plurality of sense lines traces at least partially extending along a perimeter of the central portion;

electrically isolating the sense lines traces from the central portion; and connecting alternate ones of the respective cell tab joints to the sense lines traces.

6. The method of claim 2, wherein after positioning the second plurality of cells and prior to welding, the method further includes:

bending the respective first and second tabs in an upwards direction or a downwards direction such that adjacent ones of the respective first and second tabs are bent in opposite directions.

7. A method of assembling a power module, the method comprising:

placing a first plurality of cells adjacent to one another to form a first cell layer;

placing a flexible circuit layer above the first cell layer, the flexible circuit being electrically conductive;

positioning a second plurality of cells adjacent to one another to form a second cell layer aligned relative to the first cell layer such that the flexible circuit layer is sandwiched between the first cell layer and the second cell layer;

wherein each of the first plurality of cells and the second plurality of cells has a respective cell body with respective long ends and respective short ends, the respective cell bodies of the first and the second plurality of cells being aligned;

wherein each of the first and the second plurality of cells has respective first tabs extending from one of the respective short ends and respective second tabs extending from another of the respective short ends;

welding the respective first tabs and the respective second tabs of the first plurality of cells and the second plurality of cells to the flexible circuit layer to form respective cell tab joints;

configuring the flexible circuit layer with a central portion and a plurality of sense line traces at least partially extending along a perimeter of the central portion;

electrically isolating the plurality of sense line traces from the central portion and connecting alternate ones of the respective cell tab joints to the plurality of sense line traces; and folding the flexible circuit layer along each of a plurality of axes of rotation such that at least one of the first plurality of cells directly faces another one of the first plurality of cells and at least one of the second plurality of cells directly faces another one of the second plurality of cells.

8. The method of claim 7, wherein:

the respective first tabs and the respective second tabs are composed of at least one of an aluminum, an aluminum alloy, copper and a copper alloy.

9. The method of claim 7, further comprising:

prior to folding, placing multiple resilient portions between the flexible circuit layer and the first plurality of cells such that the multiple resilient portions extend over the respective cell bodies of the first plurality of cells; and wherein the multiple resilient portions are configured to provide a spring force to accommodate an expansion and contraction of the first and second plurality of cells, the multiple resilient portions including at least one sheet of foam.

10. The method of claim 7, further comprising:

placing a plurality of heat spreaders in an alternating pattern directly outward of the first plurality of cells and the second plurality of cells;

wherein the plurality of heat spreaders includes a first heat spreader and a second heat spreader such that the first heat spreader is positioned directly outward of one of the first plurality of cells and the second heat spreader is positioned directly outward of an adjacent one of the second plurality of cells cell layer; and wherein the plurality of heat spreaders are configured to dissipate heat away from the flexible circuit layer.

11. The method of claim 7, wherein:

placing the first plurality of cells adjacent to one another includes positioning the first plurality of cells along their respective short ends;

the respective first tabs and the respective second tabs of adjacent ones of the first plurality of cells are configured to overlap at an overlap zone; and the respective first tabs and the respective second tabs are configured to be welded to the flexible circuit layer at the overlap zone.

12. The method of claim 7, wherein:

placing the first plurality of cells adjacent to one another includes positioning the first plurality of cells along their respective short ends;

the respective first tabs and the respective second tabs of adjacent ones of the first plurality of cells are configured to be spaced by a respective gap, the plurality of axes of rotation being located at the respective gaps; and welding the plurality of tabs includes welding the respective first tabs in a first weld zone and welding the respective second tabs in a second weld zone.

13. The method of claim 7, wherein:

placing the first plurality of cells adjacent to one another includes positioning the first plurality of cells along their respective long ends; and the flexible circuit layer includes respective first and second exposed portions configured to be welded to the respective first and second tabs.

14. The method of claim 7, wherein:

the flexible circuit layer includes one or more exposed portions configured to be welded to the respective first and second tabs; and the one or more exposed portions have a substantially arcuate profile.

15. The method of claim 14, wherein after positioning the second plurality of cells and prior to welding, the method further includes:

bending the respective first and second tabs in an upwards direction or a downwards direction; and wherein adjacent ones of the respective first and second tabs are bent in opposite directions.

16. The method of claim 15, wherein the one or more exposed portions are configured to be bent with the respective first and second tabs.

17. A power module assembly comprising:

a first cell layer including a first plurality of cells placed adjacent to one another;

a flexible circuit layer positioned adjacent to the first cell layer, the flexible circuit being electrically conductive;

a second cell layer positioned adjacent to the flexible circuit layer such that the flexible circuit layer is sandwiched between the first cell layer and the second cell layer, the second cell layer including a second plurality of cells placed adjacent to one another;

a plurality of heat spreaders placed in an alternating pattern directly outward of the first plurality of cells and the second plurality of cells, the plurality of heat spreaders including a first heat spreader and a second heat spreader;

wherein the alternating pattern is such that the first heat spreader is positioned directly outward of one of the first plurality of cells and the second heat spreader is positioned directly outward of an adjacent one of the second plurality of cells;

wherein the plurality of heat spreaders is configured to dissipate heat away from the flexible circuit layer; and wherein the flexible circuit layer is configured to be folded along each of a plurality of axes of rotation such that at least one of the first plurality of cells directly faces another one of the first plurality of cells and at least one of the second plurality of cells directly faces another one of the second plurality of cells.

18. The power module assembly of claim 17, wherein the plurality of heat spreaders are C-channel plates.

19. The power module assembly of claim 17, wherein:

the flexible circuit layer includes a central portion and a plurality of sense lines traces at least partially extending along a perimeter of the central portion;

the sense lines traces are configured to be electrically isolated from the central portion; and cell tab joints are connected to the sense lines traces.

20. The power module assembly of claim 17, further comprising:

multiple resilient portions positioned between the flexible circuit layer and the first plurality of cells such that the multiple resilient portions extend over respective cell bodies of the first plurality of cells; and wherein the multiple resilient portions are configured to provide a spring force to accommodate an expansion and contraction of the first and second plurality of cells, the multiple resilient portions including at least one sheet of foam.

21. The power module assembly of claim 17, wherein:

each of the first plurality of cells and the second plurality of cells has a respective cell body with respective long ends and respective short ends, the respective cell bodies of the first and the second plurality of cells being aligned;

each of the first and the second plurality of cells has respective first tabs extending from one of the respective short ends and respective second tabs extending from another of the respective short ends; and the respective first tabs and the respective second tabs of the first plurality of cells and the second plurality of cells are welded to the flexible circuit layer to form respective cell tab joints.

22. The power module assembly of claim 21, wherein:

prior to being welded, the respective first and second tabs are configured to be bent in an upwards direction or a downwards direction such that adjacent ones of the respective first and second tabs are bent in opposite directions.

23. The power module assembly of claim 21, wherein:

the respective first tabs and the respective second tabs are composed of at least one of an aluminum, an aluminum alloy, copper and a copper alloy.

24. The power module assembly of claim 21, wherein:

the first plurality of cells is positioned adjacent to one another along their respective short ends;

the respective first tabs and the respective second tabs of adjacent ones of the first plurality of cells are configured to overlap at an overlap zone; and the respective first tabs and the respective second tabs are configured to be welded to the flexible circuit layer at the overlap zone.

25. The power module assembly of claim 21, wherein:

the first plurality of cells is positioned adjacent to one another along their respective short ends;

the respective first tabs and the respective second tabs of adjacent ones of the first plurality of cells are configured to be spaced by a respective gap, the plurality of axes of rotation being located at the respective gaps; and the respective first tabs and the respective second tabs are configured to be welded to the flexible circuit layer in a first weld zone and a second weld zone, respectively.

* * * * *